(12) United States Patent
Amasuga et al.

(10) Patent No.: US 7,642,567 B2
(45) Date of Patent: Jan. 5, 2010

(54) FIELD-EFFECT TRANSISTOR AND METHOD OF MANUFACTURING THE SAME

(75) Inventors: Hirotaka Amasuga, Tokyo (JP); Masahiro Totsuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 325 days.

(21) Appl. No.: 11/689,527

(22) Filed: Mar. 22, 2007

(65) Prior Publication Data

US 2008/0087916 A1    Apr. 17, 2008

(30) Foreign Application Priority Data

Oct. 12, 2006   (JP)   ................ 2006-278464

(51) Int. Cl.
    *H01L 29/00*   (2006.01)
(52) U.S. Cl. ................ 257/194; 257/E29.252
(58) Field of Classification Search .......... 257/194, 257/E29.252, E21.407, E21.624; 438/167, 438/172, 574
    See application file for complete search history.

(56) References Cited

U.S. PATENT DOCUMENTS

| 5,970,322 | A  |    | 10/1999 | Ichikawa et al. |         |
|-----------|----|----|---------|-----------------|---------|
| 6,448,119 | B1 |    | 9/2002  | Onda            |         |
| 6,486,077 | B2 | *  | 11/2002 | Sato            | 438/763 |
| 6,720,200 | B2 |    | 4/2004  | Yamaguchi et al.|         |
| 7,387,955 | B2 | *  | 6/2008  | Ahn et al.      | 438/574 |

FOREIGN PATENT DOCUMENTS

| JP | 4-62938 A   | 9/1992  |
| JP | 5-063003 A  | 3/1993  |
| JP | 9-8283      | 1/1997  |
| JP | 11-354542 A | 12/1999 |

OTHER PUBLICATIONS

Masuda, A. et al., Highly moisture-resistive silicon nitride films prepared by catalytic chemical vapor deposition and application to gallium arsenide field-effect transistors, *Vaccum*, 74:525-529 (2004).

* cited by examiner

*Primary Examiner*—Zandra Smith
*Assistant Examiner*—Paul E Patton
(74) *Attorney, Agent, or Firm*—Leydig, Voit & Mayer, Ltd.

(57) ABSTRACT

A low-cost field-effect transistor with a moisture-resistant gate covered by a thick moisture-resistant insulating film which suppresses an increase in gate capacitance, and a method of manufacturing the field-effect transistor. The field-effect transistor has one of a T-shaped gate electrode and Γ-shaped gate electrode, a drain electrode, and a source electrode, the source electrode and the drain electrode being electrically connected through an n-doped semiconductor region. The gate, source, and drain electrodes are located on a semiconductor layer which includes an insulating film having a thickness of 50 nm or less and covering a surface of the gate electrode and a surface of the semiconductor layer. A silicon nitride film, deposited by catalytic CVD, covers the insulating film and includes a void volume located between a portion of the gate electrode corresponding to a canopy of an open umbrella and the semiconductor layer.

13 Claims, 4 Drawing Sheets

FIELD-EFFECT TRANSISTOR AND METHOD OF MANUFACTURING THE SAME

BACKGROUND OF THE INVENTION

1. Field of the Invention

The present invention relates to a field-effect transistor, which is mainly suitable for use in a high frequency band such as equal to or higher than 1 GHz, and to a method of manufacturing the same.

2. Description of the Related Art

Various kinds of systems based on WiMAX or the like, for radio communication using a high frequency band such as equal to or higher than 1 GHz, including mobile phones which are prevailing these days, are under development and infrustructing. Further, markets for millimeter wave radio systems such as 60-GHz band high-speed and large-capacity communication systems and 70-to-80-GHz band vehicle-mounted radar systems are expected to expand in the future. A compound semiconductor, in particular, a field-effect transistor such as a MESFET, an HFET, or an HEMT in which a GaAs is used as a substrate is used for parts for transmitting/receiving a radio signal in such a high frequency band. Generally, cost reduction of a terminal systems is indispensable to make a communication system widely available.

In a silicon process, silicon and a silicon oxide film used as a surface insulating film and formed by thermal oxidation, are basically very stable and have excellent moisture resistance. Further, multilayer wiring with an interlayer insulating film sandwiched therebetween is laminated on a semiconductor, and the multilayer wiring is also effective for enhancing the moisture resistance.

However, with regard to a compound semiconductor field-effect transistor used in a transmission/reception module of a terminal, in addition to basically very low moisture resistance of the compound semiconductor itself, the moisture resistance of a laminated insulating film is not so high. When the film thickness is as small as 100 nm or less, because the covering is not sufficient at irregularities and for other reasons, moisture can easily intrudes, which deteriorates characteristics of the transistor. Therefore, conventionally, the transistor is used after being encapsulated in an airtight package.

However, because such an airtight package is more expensive than a transistor chip itself, it is required to enhance the moisture resistance of the transistor chip itself in order to reduce costs while adopting a simpler package. Accordingly, in order to enhance the moisture resistance, it is proposed to make a moisture-resistant insulating film thicker.

However, because the transistor operates in a high frequency band, if the moisture-resistant insulating film is made thicker, the spatial capacity increases, which results in deteriorated characteristics. In particular, in an HEMT structure which is often used in a millimeter wave band, existence of an insulating film between a gate and a semiconductor surface results in considerable increase in gate capacitance and considerable reduction in gain.

Accordingly, in order to prevent increase in the spatial capacity, there is proposed a method of manufacturing a semiconductor device, in which a silicon oxide film to be a spacer in gate lift-off is laminated on an n-type active layer, a silicon nitride film which is thinner than the oxide film is laminated thereon, and after patterning of a photoresist is carried out in a portion where a gate is to be formed, the nitride film is removed by dry etching. After that, only the oxide film is removed to the substrate by wet etching while almost no etching is effected to the nitride film, and then, side etching is carried out to provide a cavity below the nitride film. After that, a recess is formed, a gate metal is formed by vapor deposition, lift-off is carried out at the resist to form the gate, and a passivation film is laminated so that the space between the nitride film and the gate is filled and the space in the recess is left as a cavity (see, for example, JP 05-63003 A).

However, since the gate is formed after the recess is formed, and the space between the silicon nitride film and the gate is filled and the space in the recess is left as a cavity, many process steps are necessary for forming the recess, i.e., the process steps of laminating with the silicon oxide film and the silicon nitride film, providing an opening in the silicon nitride film to provide a gate electrode, removing the silicon oxide film from the opening to the n-type active layer, and providing the cavity below the silicon nitride film by side etching, and thus there is a problem in that the costs are increased.

SUMMARY OF THE INVENTION

Accordingly, an object of the present invention is to provide a low-cost field-effect transistor with moisture-resistant treatment being effected around a gate by laminating a thick moisture-resistant insulating film which suppresses increase in gate capacitance, and a method of manufacturing the field-effect transistor.

According to the present invention, a field-effect transistor, in which one of a T-shaped electrode and Γ-shaped gate electrode, a drain electrode, and a source electrode, the source electrode and the drain electrode being arranged through an n-doped semiconductor region, are located on a semiconductor layer, includes: an insulating film having a thickness of 50 nm or less for covering a surface of the gate electrode and a surface of the semiconductor layer; and a silicon nitride film deposited by catalytic CVD for covering the insulating film, in which a cavity is formed by the silicon nitride film between a portion of the gate electrode corresponding to a canopy of an open umbrella and the semiconductor layer.

An effect of the field-effect transistor according to the present invention is that, a cavity can be formed between a portion of the gate electrode corresponding to a canopy of an open umbrella and the semiconductor layer by depositing a thick silicon nitride film having the effect of resisting moisture by catalytic CVD, so process steps of forming the cavity can be eliminated, and thus cost in the manufacturing process can be reduced.

DESCRIPTION OF THE PREFERRED EMBODIMENTS

Embodiment 1

Figure 1:
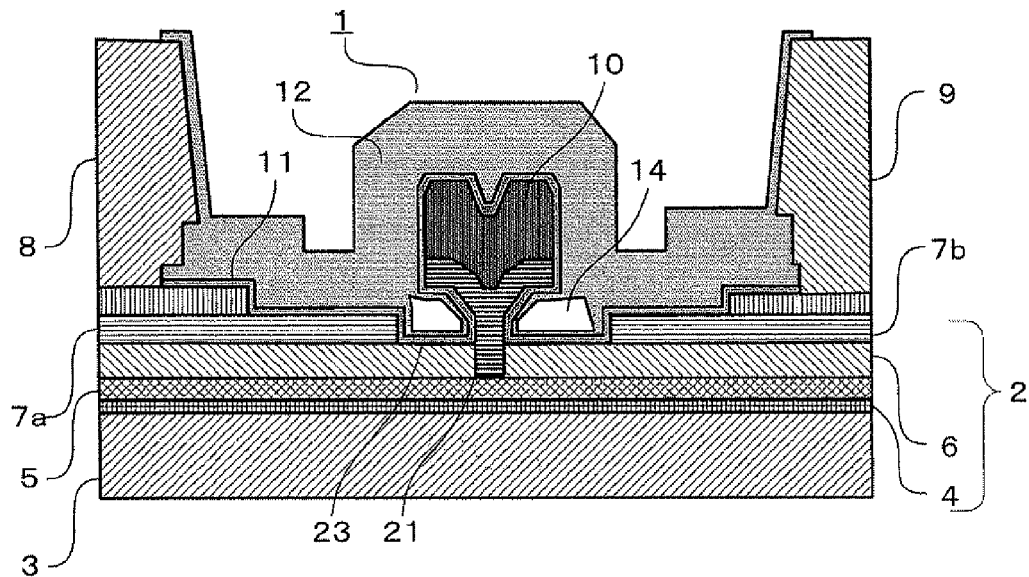
FIG. 1 is a sectional view of a field-effect transistor according to Embodiment 1 of the present invention.

FIG. 1 is a sectional view of a field-effect transistor according to Embodiment 1 of the present invention.

As illustrated in FIG. 1, a field-effect transistor 1 according to Embodiment 1 of the present invention has a buffer layer 3 formed of an undoped GaAs epitaxial layer grown on a semi-insulating GaAs substrate as a semi-insulating substrate, a channel layer 4 formed of an undoped GaAs epitaxial layer grown on the buffer layer 3, a gate contact layer 5 formed of an undoped AlGaAs epitaxial layer grown on the channel layer 4, a gate embedding layer 6 formed of an undoped GaAs epitaxial layer grown on the gate contact layer 5, and two capping layers 7a and 7b formed of an $n^+$-type GaAs epitaxial layer grown on the gate embedding layer 6 and patterned so as to be apart from each other by a predetermined distance. It is to be noted that the buffer layer 3, the channel layer 4, the gate contact layer 5, the gate embedding layer 6, and the capping layers 7a and 7b are comprehensively referred to as a semiconductor layer 2.

The undoped AlGaAs epitaxial layer is formed of a lightly n-doped intrinsic semiconductor, and the undoped GaAs epitaxial layers are formed of a lightly n-doped intrinsic semiconductor.

The field-effect transistor 1 according to Embodiment 1 further has a source electrode 8 formed on the capping layer 7a, a drain electrode 9 formed on the capping layer 7b, a gate electrode 10 part of which is embedded in the gate embedding layer 6 for controlling electric current through the channel layer 4 between the source electrode 8 and the drain electrode 9, an insulating film 11 for covering an exposed surface of the semiconductor layer 2, and a moisture-resistant insulating film 12 covering the insulating film 11.

A through hole 21 which exposes the gate contact layer 5 at the bottom thereof is formed in the gate embedding layer 6.

There is provided a recess 23 including the through hole 21. A section of the recess 23 is larger than that of the through hole 21 and the gate embedding layer 6 appears at the bottom of the recess 23.

The gate electrode 10 has an umbrella-like T-shaped gate structure, and a portion of the gate electrode 10 corresponding to a shank of an umbrella passes through the through hole 21, and one end of the portion corresponding to the shank of the umbrella is in contact with the gate contact layer 5 while a portion corresponding to a canopy of the umbrella is open. The gate electrode 10 has a two-layer structure of TaN/Au. It is to be noted that, while it is indispensable that the gate length of a field-effect transistor of a millimeter wave band HEMT structure is 0.5 μm or less, short gate length increases gate resistance resulting in lowered gain, and thus, in order to decrease the gate resistance, it is necessary that the gate electrode 10 have the T-shaped gate structure with the portion corresponding to a canopy of an umbrella which is not in contact with the semiconductor layer 2 open. Further, it is a gate-drain capacitance which is greatly affected by the portion of the gate electrode 10 corresponding to a canopy of an umbrella, so whether the portion corresponding to the canopy of the umbrella overhangs or not on the side of the source has nothing to do with the present invention. That is, gate electrode 10 has the T-shaped gate structure when the portion corresponding to the canopy of the umbrella overhangs on the side of the source and has a Γ-shaped gate structure when the portion corresponding to the canopy of the umbrella does not overhang on the side of the source.

Figure 2:
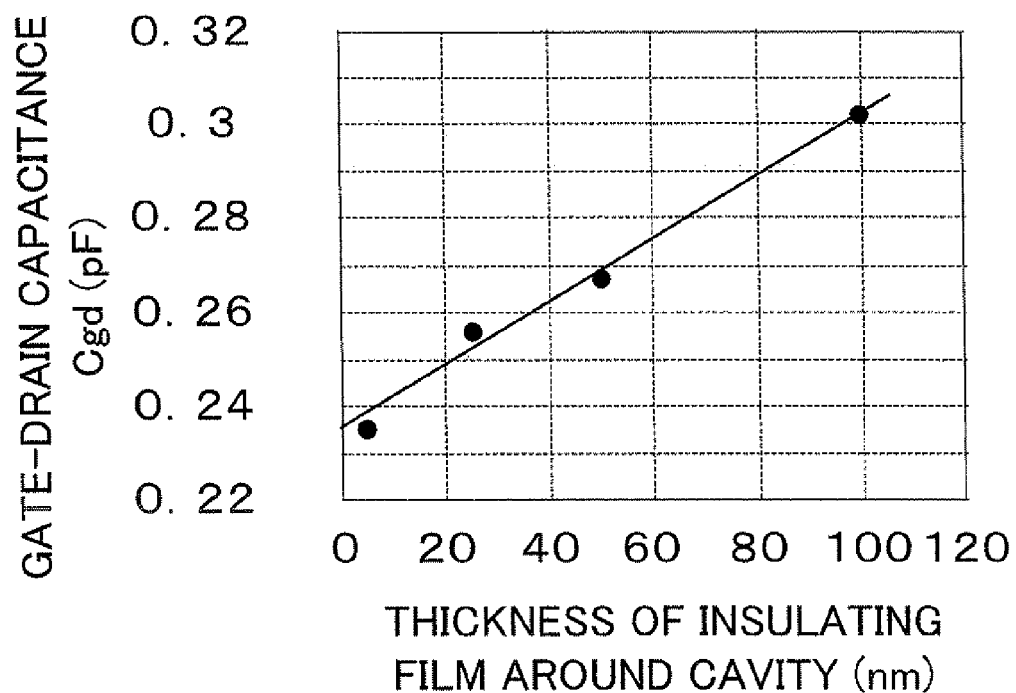
FIG. 2 is a graph of results obtained through a simulation of gate-drain capacitance with a thickness of an insulating film around a cavity varied.

Results of a simulation of gate-drain capacitance Cgd with the thickness of the insulating film being a variable is illustrated in FIG. 2. Because the thicker the insulating film becomes, the larger the gate-drain capacitance Cgd becomes, the insulating film 11 having a thickness of 50 nm or less which is ordinarily used in a process is formed on surfaces of the gate embedding layer 6 where the cavity is formed, of the capping layers 7a and 7b, and of the gate electrode 10. By covering the surface of the semiconductor layer 2 with the insulating film 11 in this way, the surface of the semiconductor layer 2 is prevented from being exposed to a vapor phase, and the device characteristics are prevented from being varied due to instability such as a surface defect.

The moisture-resistant insulating film 12 covers a side surface of the source electrode 8, the surfaces of the capping layers 7a and 7b, the surface of the gate embedding layer 6, and portions of the gate electrode 10 corresponding to an upper surface and a side surface of the canopy of the open umbrella as a whole.

As the moisture-resistant insulating film 12, a silicon nitride film (hereinafter referred to as "SiNx film" and including ones which are not stoichiometric such as $Si_3N_4$) formed by catalytic CVD is suitable. It is to be noted that, as the moisture-resistant insulating film 12, a silicon oxide film (SiO film), a silicon oxynitride film (SiON film), and the like are also ordinarily used. Their permittivities are lower than that of the SiNx film, so the capacitance can be decreased, but on the other hand, they are inferior in the moisture resistance and chemical resistance.

Further, in the field-effect transistor 1 according to Embodiment 1, a cavity 14 is formed between the portion of the gate electrode 10 corresponding to the canopy of the open umbrella and the semiconductor layer 2.

A manufacturing method of forming the cavity 14 is now described in the following. In order to form the cavity 14, the SiNx film is formed by catalytic CVD.

In the catalytic CVD, a high-temperature tungsten wire provided above a wafer acts as a catalyst when silane ($SiH_4$) and ammonia ($NH_3$) react, and the SiNx film can be formed without heating the wafer and without using plasma or the like. Because plasma is not generated, the surface of the semiconductor layer 2 is not damaged, and the formed SiNx film can have a very high index of refraction (index of refraction n of about 2.05), and its moisture resistance and chemical resistance (against diluted fluoric acid) are also very high. It is to be noted that the characteristics of the SiNx film formed by the catalytic CVD is described in detail in "Highly moisture-resistive silicon nitride films prepared by catalytic chemical vapor deposition and application to gallium arsenide field-effect transistors" by A. Masuda and four others, Vacuum, Vol. 74, 2004, pp. 525-529.

In the catalytic CVD, the temperature of a wafer substrate can be made as low as 300° C. or less (in ordinary plasma CVD, the temperature of a wafer substrate is 400-600° C.), which is also effective in forming a film having a high index of refraction. Further, since the temperature of the wafer substrate is low, SiNx does not diffuse much at the surface, and little SiNx goes around to the surface of the gate embedding layer 6 covered by the portion of the gate electrode 10 corresponding to the canopy of the open umbrella and the side surface of the gate electrode 10 corresponding to the shank of the umbrella. Normally, the fact that little SiNx goes around may be a weak point in that covering of the surface of the gate embedding layer 6 with the portion of the gate electrode 10 corresponding to the canopy of the umbrella is insufficient. In contrast, in the present invention, a paradigm shift occurs. The SiNx film on the portion of the gate electrode 10 corresponding to the canopy of the umbrella and the SiNx film on the capping layers 7a and 7b join together, respectively, and the cavity 14 isolated from the outside can be formed with respect to the joined SiNx film on the side of the gate embedding layer 6.

By laminating by the catalytic CVD the thick SiNx film on the surface of the semiconductor layer 2 including the gate electrode 10 in this way, moisture resistance can be sufficiently maintained. Further, by forming the cavity 14 between the portion of the gate electrode 10 corresponding to the canopy of the open umbrella and the semiconductor layer 2, the gate-drain capacitance can be lower as compared with a case where the space between the portion of the gate electrode 10 corresponding to the canopy of the open umbrella and the semiconductor layer 2 is filled with the insulating film. In this sense, deposition of SiNx by the catalytic CVD is an optimum manufacturing method of forming the cavity 14 between the portion of the gate electrode 10 corresponding to the canopy of the open umbrella and the semiconductor layer 2.

When the SiNx film is deposited by the catalytic CVD, SiNx is deposited such that the film thickness on a planar portion is 200 nm or more. This is because, when the SiNx film is deposited on an irregular structure by the catalytic CVD, it is known that a film thickness on irregular side surfaces is half as much as that on a planar portion or less. The film thickness has to be 50-100 nm or more all over the SiNx film in order to improve the moisture resistance, so it is necessary that the film thickness on a planar portion be 200 nm or more. It is to be noted that the SiNx film may be only one layer or may be formed by laminating a plurality of layers.

The longer the distance between the portion of the gate electrode 10 corresponding to the canopy of the open umbrella and the semiconductor layer 2 becomes, the more the gate capacitance can be decreased, and thus, it is effective to make the distance longer. On the other hand, in order to form the cavity 14 by depositing the SiNx film using the catalytic CVD, it is necessary that the distance between the portion of the gate electrode 10 corresponding to the canopy of the open umbrella and the semiconductor layer 2 be equal to or less than the thickness of the SiNx film.

The gate-drain capacitance is greatly affected by the behavior of a depletion layer in the semiconductor layer 2, but is also affected by an external structure, especially the distance between the portion of the gate electrode 10 corresponding to the canopy of the open umbrella and the capping layer 7b. This can be regarded as pseudo parallel plate capacitance between the portion of the gate electrode 10 corresponding to the canopy of the open umbrella and the capping layer 7b.

Therefore, the gap between an end on the side of the drain electrode 9 of the portion of the gate electrode 10 corresponding to the canopy of the open umbrella and an end of the capping layer 7b on the side of the gate electrode 10 (hereinafter abbreviated as "Lgd") is varied in a simulation to find the gate-drain capacitance Cgd. It is to be noted that the portion of the gate electrode 10 corresponding to the canopy of the open umbrella overhangs on the side of the drain electrode 9 by a length of 0.75 μm in the simulation.

Figure 3:
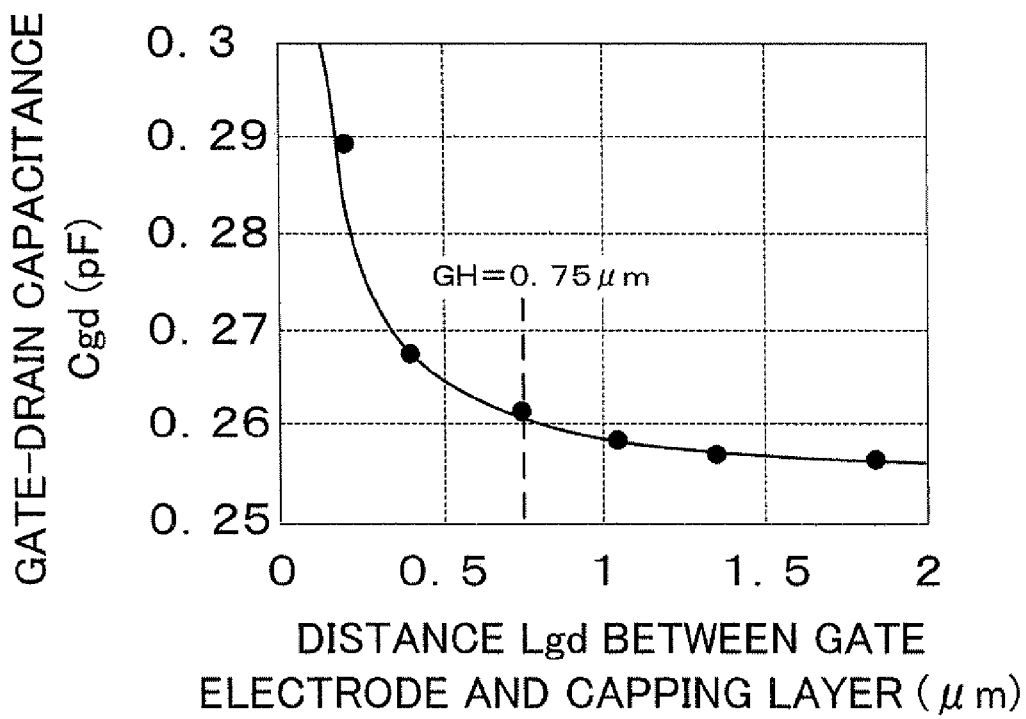
FIG. 3 is a graph of results obtained through a simulation of the gate-drain capacitance with a distance between a canopy of an open umbrella of a gate electrode and a capping layer varied.

The results of the simulation are illustrated in FIG. 3, in which the gate-drain capacitance Cgd is inversely proportional to Lgd. When Lgd changes from 0.2 μm to 0.75 μm, the gate-drain capacitance Cgd is decreased by 0.03 pF, while, when Lgd changes from 0.75 μm to 1.85 μm, the gate-drain capacitance Cgd is decreased only by 0.005 pF. Therefore, it is assumed that, by making Lgd equal to or more than the length by which the portion of the gate electrode 10 corresponding to the canopy of the open umbrella overhangs on the side of the drain electrode 9, the pseudo parallel plate capacitance becomes sufficiently small.

Further, in Embodiment 1, the semiconductor layer is explained by using each of epitaxial layers of compound semiconductors AlGaAs and GaAs, each of which has GaAs as a base. In addition, an epitaxial layer having as a base gallium nitride (GaN), aluminum arsenide (AlAs), gallium phosphide (GaP), gallium antimonide (GaSb), aluminum nitride (AlN), indium nitride (InN), indium phosphide (InP), or the like can be used as the semiconductor layer.

Although the T-shaped gate structure of the gate electrode 10 is described as the two-layer structure of TaN/Au, it may be other T-shaped gate structures including a Ti/Al structure, a Ti/Pt/Au structure, and a WSi/Au structure.

Further, although, in the T-shaped gate structure, the portion where the gate is joined to the semiconductor is embedded, the portion may not be embedded.

Further, although the recess 23 is on the semiconductor surface adjacent to the gate, the recess 23 may be omitted.

Embodiment 2

Figure 4:
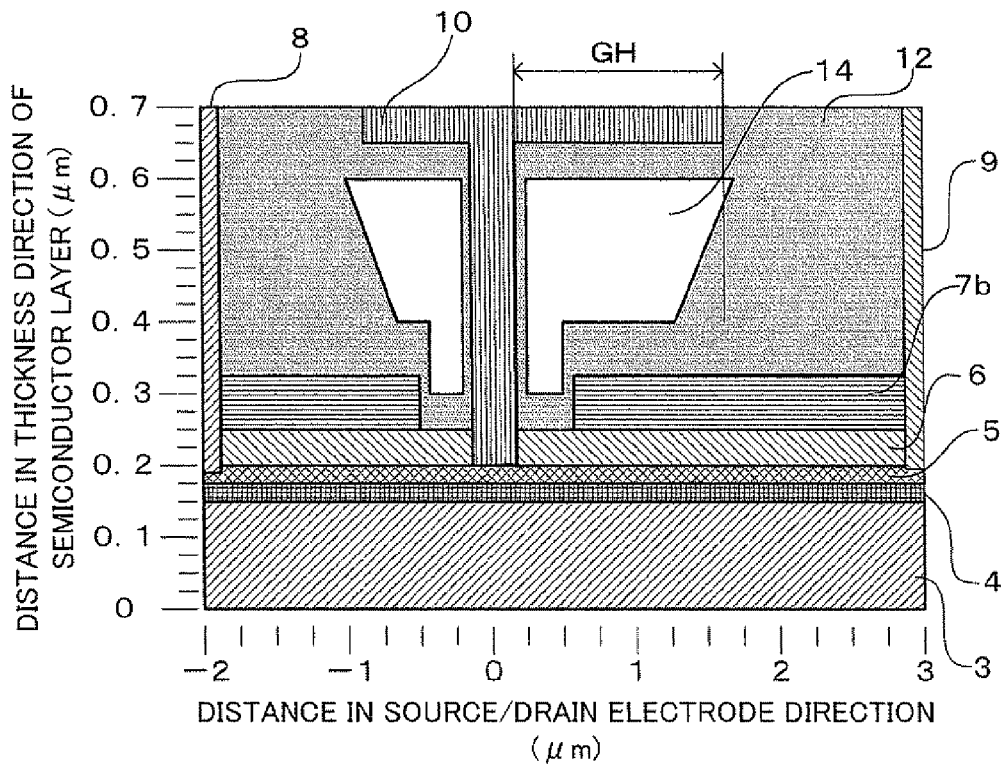
FIG. 4 illustrates a computing device model used when the gate-drain capacitance is simulated.

FIG. 4 illustrates a computing device model used when the gate-drain capacitance is simulated.

In Embodiment 2, the length by which the portion of the gate electrode 10 corresponding to the canopy of the open umbrella of the field-effect transistor 1 according to Embodiment 1 overhangs on the side of the drain electrode 9 (hereinafter referred to as "gate overhang on drain side GH") is made varied to simulate the gate-drain capacitance Cgd.

In the simulation, the computing device model illustrated in FIG. 4 is used, and SiNx having the relative permittivity of 7.55 fills the space on the gate and between the source electrode 8 and the drain electrode 9. The gate-drain capacitance Cgd is simulated with regard to a structure where the cavity 14 is formed between the portion of the gate electrode 10 corresponding to the canopy of the open umbrella and the semiconductor layer 2 (structure according to Embodiment 2), a structure where a low permittivity film having the relative permittivity of 2.1 fills the space on the gate and between the source electrode 8 and the drain electrode 9 including the space between the portion of the gate electrode 10 corresponding to the canopy of the open umbrella and the semiconductor layer 2 (structure of Comparative Example 1), and a structure where silicon oxide having the relative permittivity of 3.9 fills the space on the gate and between the source electrode 8 and the drain electrode 9, including the space between the portion of the gate electrode 10 corresponding to the canopy of the open umbrella and the semiconductor layer 2 (structure of Comparative Example 2).

It is to be noted that the gate voltage is −2 V, and the drain voltage is 0 V in the simulation.

Examples of gate capacitance include the gate-drain capacitance Cgd and a gate-source capacitance. However, the gate-source capacitance roughly depends on a depletion layer capacitance in the semiconductor, especially on a gate junction area and is hardly affected by an external structure, so it is not considered here.

Figure 5:
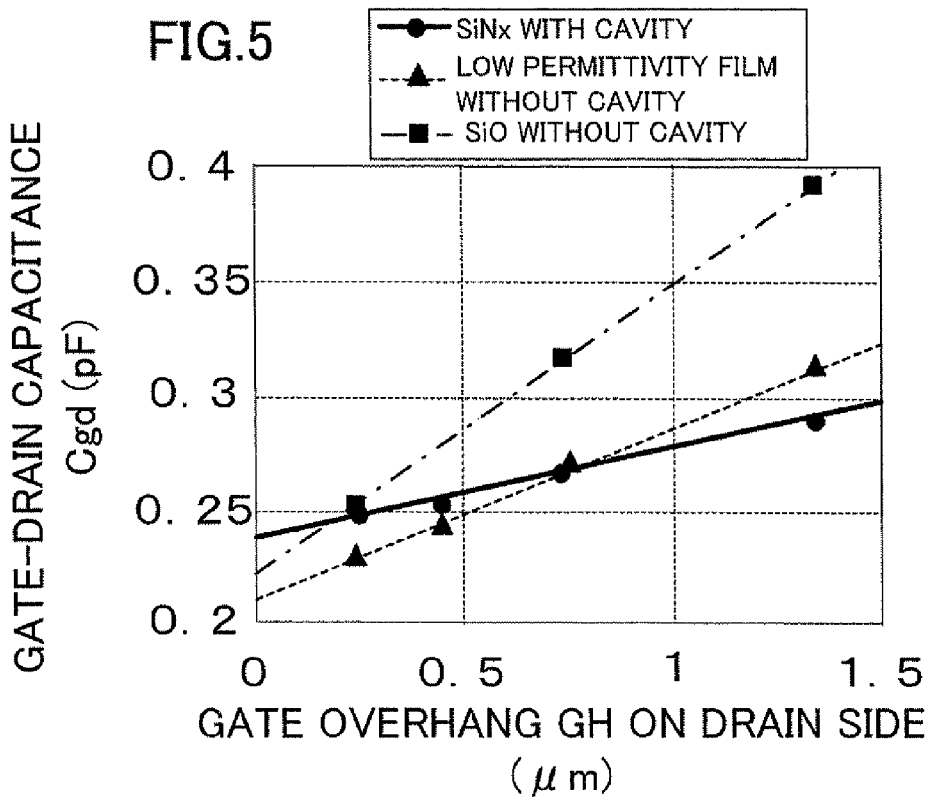
FIG. 5 is a graph of results obtained through a simulation of the gate-drain capacitance using the computing device model with gate overhang on a drain side varied.

The result of the simulation is illustrated in FIG. 5. While the gate-drain capacitance Cgd tends to be increased as the gate overhang on the drain side GH becomes larger in all of the structures, a rate of increase in the computing device model of the structure according to Embodiment 2 is lower than those in the computing device models of the structures according to Comparative Examples 1 and 2. The gate-drain capacitance Cgd of the computing device model of the structure according to Embodiment 2 is equal to that of the computing device model of the structure according to Comparative Example 1 when the gate overhang on the drain side GH is 0.8 μm, and the gate-drain capacitance Cgd of the computing device model of the structure according to Embodiment 2 becomes smaller than that in the case of Comparative Example 1 when the gate overhang on the drain side GH becomes larger.

Further, the gate-drain capacitance Cgd of the computing device model of the structure according to Embodiment 2 becomes smaller than that of the computing device model of the structure according to Comparative Example 2 when the gate overhang on the drain side GH is 0.2 μm or more.

In this way, by making the length GH by which the portion of the gate electrode 10 corresponding to the canopy of the open umbrella overhangs on the side of the drain electrode 9 be 0.9 μm or more, the gate resistance can be decreased, and at the same time, the gate-drain capacitance Cgd can be made smaller than that of a structure where the low permittivity film fills the space.

It is to be noted that, although the simulation is with regard to a case where the film having the relative permittivity of 2.1 is used as the low permittivity film, the relative permittivity of 2.1 is one of the lowest ones of low permittivity films which are often used now. However, because there is a high risk that a low relative permittivity results in a coarse film, such a film is not effective with regard to the moisture resistance.

Embodiment 3

Figure 6:
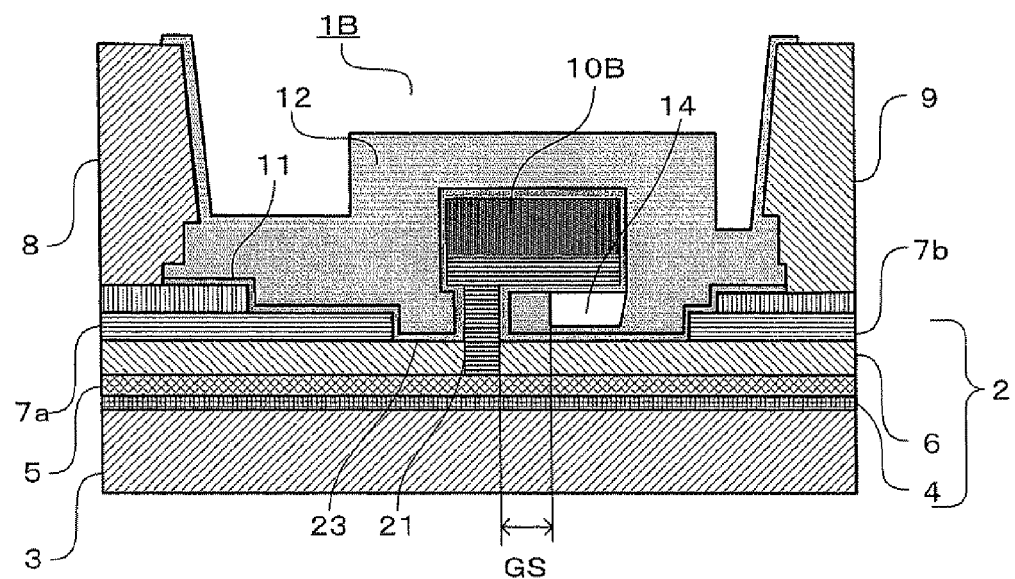
FIG. 6 is a sectional view of a field-effect transistor according to Embodiment 3 of the present invention.

FIG. 6 is a sectional view of a field-effect transistor according to Embodiment 3 of the present invention.

A field-effect transistor 1B according to Embodiment 3 of the present invention is similar to the field-effect transistor 1 according to Embodiment 1 except for the gate electrode 10B, and thus, like reference symbols are used to denote like or identical members and description of those is omitted.

As illustrated in FIG. 6, the gate electrode 10B according to Embodiment 3 has a Γ-shaped gate structure where a portion corresponding to a canopy of an open umbrella overhangs only on the side of the drain electrode 9. SiNx fills the space between the portion of the gate electrode 10B corresponding to the canopy of the open umbrella and the semiconductor layer 2, from the side surface of the gate electrode 10B corresponding to a shank of the umbrella so as to extend to the side of the drain electrode 9, and the remaining space is left as the cavity 14.

Withstand voltage and gate-drain capacitance Cgd of the field-effect transistor 1B according to Embodiment 3 is simulated. In the simulation, the width of SiNx extending from the side surface of the gate electrode 10B corresponding to the shank of the umbrella to the side of the drain electrode 9 (hereinafter referred to as "gate stem side insulating film width GS") is made varied to obtain the withstand voltage and the gate-drain capacitance Cgd. It is to be noted that the withstand voltage is represented as gate-drain voltage $Vgd_0$ when leakage current reaches 0.1 mA/mm. Further, in the simulation, the length GH by which the portion of the gate electrode 10B corresponding to the canopy of the open umbrella overhangs on the side of the drain electrode 9 is 2 μm. Therefore, the gate stem side insulating film width GS is varied in a range from 0 μm to 2 μm.

Figure 7:
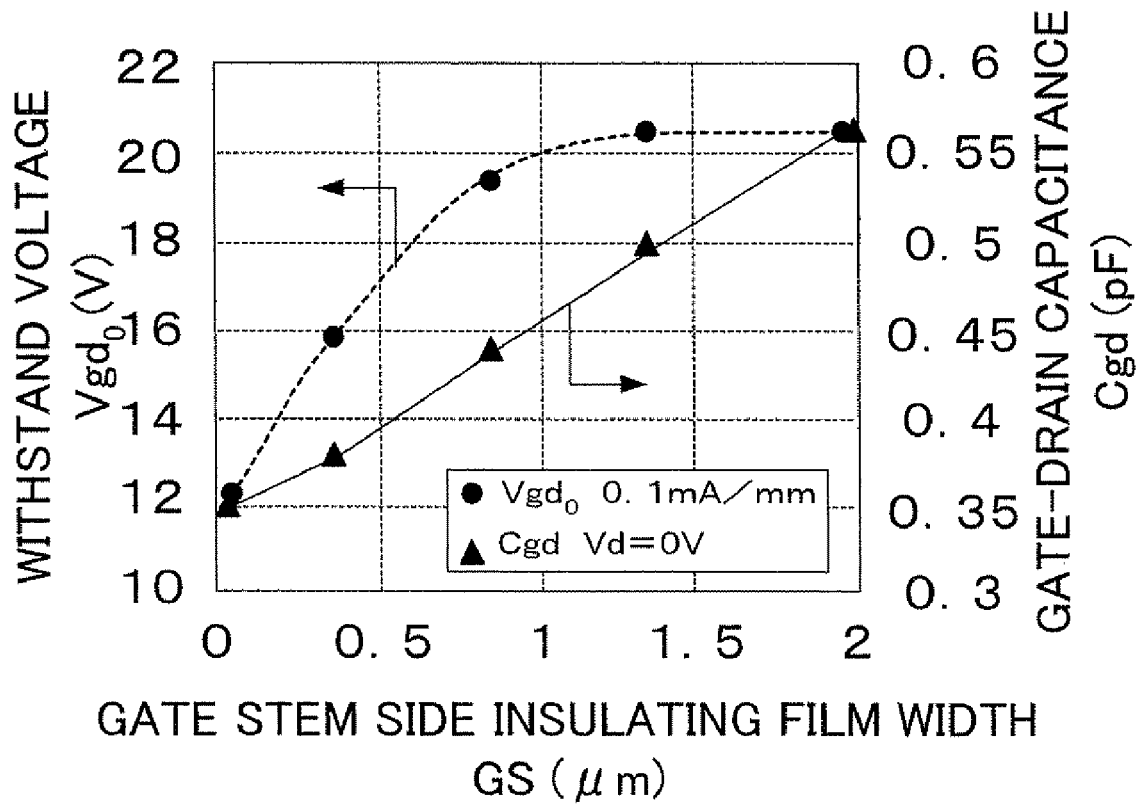
FIG. 7 is a graph of results obtained through a simulation of withstand voltage and the gate-drain capacitance with a width of an insulating film extending from a side surface of a Γ-shaped gate electrode corresponding to a shank of an umbrella to a side of a drain electrode varied.

The result of the simulation is illustrated in FIG. 7. While the gate-drain capacitance Cgd increases approximately in proportion to the gate stem side insulating film width GS, the withstand voltage $Vgd_0$ is saturated when the gate stem side insulating film width GS is 1 μm or more. Therefore, if the gate stem side insulating film width GS is about 1 μm, while the withstand voltage $Vgd_0$ is almost the same as in a case where the cavity 14 does not exist, the amount of increase of the gate-drain capacitance Cgd is half as much as that when the cavity 14 does not exist, and thus, the withstand voltage $Vgd_0$ can be improved, and at the same time, increase in the gate-drain capacitance Cgd can be suppressed.

What is claimed is:

1. A field-effect transistor comprising:
   a semiconductor layer;
   one of a T-shaped gate electrode and a Γ-shaped gate electrode, a drain electrode, and a source electrode, the source electrode and the drain electrode being electrically connected through an n-doped semiconductor region of the semiconductor layer, the gate, drain, and source electrodes being located on the semiconductor layer;
   an insulating film having a thickness not exceeding 50 nm and covering a surface of the gate electrode and a surface of the semiconductor layer; and
   a silicon nitride film deposited by catalytic chemical vapor deposition and covering the insulating film, wherein the silicon nitride film includes, within the silicon nitride film, a void volume that is located between a portion of the gate electrode corresponding to a canopy of an open umbrella and the insulating film.

2. The field-effect transistor according to claim 1, wherein:
   the silicon nitride film deposited by catalytic chemical vapor deposition has a thickness of at least 200 nm at a planar portion; and
   shortest distance between the portion of the gate electrode corresponding to the canopy of the open umbrella and the semiconductor layer is no larger than the thickness of the silicon nitride film.

3. The field-effect transistor according to claim 1, wherein the portion of the gate electrode corresponding to the canopy of the open umbrella overhangs on a side of the gate electrode, toward the drain electrode, by at least 0.9 μm.

4. The field-effect transistor according to claim 2, wherein the portion of the gate electrode corresponding to the canopy of the open umbrella overhangs on a side of the gate electrode, toward the drain electrode, by at least 0.9 μm.

5. The field-effect transistor according to claim 1, wherein:
   the portion of the gate electrode corresponding to the canopy of the open umbrella overhangs on the side of the gate electrode, toward the drain electrode, by at least 1 μm; and
   space between the portion of the gate electrode corresponding to the canopy of the open umbrella and the insulating film is filled with the silicon nitride film from a side surface of the gate electrode, corresponding to a shank of the umbrella, and extending less than 1 μm toward the drain electrode, wherein remaining space constitutes the void volume.

6. The field-effect transistor according to claim 2, wherein:
   the portion of the gate electrode corresponding to the canopy of the open umbrella overhangs on the side of the gate electrode, toward the drain electrode, by at least 1 μm; and
   space between the portion of the gate electrode corresponding to the canopy of the open umbrella and the insulating film is filled with the silicon nitride film from a side surface of the gate electrode, corresponding to a shank of the umbrella, and extending less than 1 µm toward the drain electrode, wherein remaining space constitutes the void volume.

7. The field-effect transistor according to claim 3, wherein:
the portion of the gate electrode corresponding to the canopy of the open umbrella overhangs on the side of the gate electrode, toward the drain electrode, by at least 1 µm; and
space between the portion of the gate electrode corresponding to the canopy of the open umbrella and the insulating film is filled with the silicon nitride film from a side surface of the gate electrode, corresponding to a shank of the umbrella, and extending less than 1 µm toward the drain electrode, wherein remaining space constitutes the void volume.

8. The field-effect transistor according to claim 4, wherein:
the portion of the gate electrode corresponding to the canopy of the open umbrella overhangs on the side of the gate electrode, toward the drain electrode, by at least 1 µm; and
space between the portion of the gate electrode corresponding to the canopy of the open umbrella and the insulating film is filled with the silicon nitride film from a side surface of the gate electrode, corresponding to a shank of the umbrella, and extending less than 1 µm toward the drain electrode, wherein remaining space constitutes the void volume.

9. A method of manufacturing a field-effect transistor, the field-effect transistor having one of a T-shaped gate electrode and a Γ-shaped gate electrode on a semiconductor layer, comprising:
forming an insulating film having a thickness not exceeding 50 nm covering the gate electrode and a surface of the semiconductor layer; and
depositing a silicon nitride film by catalytic chemical vapor deposition on the insulating film, the silicon nitride film including, as deposited, a void volume within the silicon nitride film and located between a portion of the gate electrode corresponding to a canopy of an open umbrella and the insulating film.

10. A field-effect transistor comprising:
one of a T-shaped gate electrode and a Γ-shaped gate electrode, a drain electrode, and a source electrode, the source electrode and the drain electrode being electrically connected through an n-doped semiconductor region, the gate, drain, and source electrodes being located on a semiconductor layer;
an insulating film having a thickness not exceeding 50 nm and covering a surface of the gate electrode and a surface of the semiconductor layer; and
a silicon nitride film deposited by catalytic chemical vapor deposition and covering the insulating film, wherein
the silicon nitride film includes a void volume located between a portion of the gate electrode corresponding to a canopy of an open umbrella and the semiconductor layer,
the silicon nitride film deposited by catalytic chemical vapor deposition has a thickness of at least 200 nm at a planar portion, and
shortest distance between the portion of the gate electrode corresponding to the canopy of the open umbrella and the semiconductor layer is no larger than the thickness of the silicon nitride film.

11. The field-effect transistor according to claim 10, wherein the portion of the gate electrode corresponding to the canopy of the open umbrella overhangs on a side of the gate electrode, toward the drain electrode, by at least 0.9 µm.

12. The field-effect transistor according to claim 10, wherein:
the portion of the gate electrode corresponding to the canopy of the open umbrella overhangs on the side of the gate electrode, toward the drain electrode, by at least 1 µm; and
space between the portion of the gate electrode corresponding to the canopy of the open umbrella and the semiconductor layer is filled with the silicon nitride film from a side surface of the gate electrode corresponding to a shank of the umbrella and extending less than 1 µm toward the drain electrode, and remaining space constitutes the void volume.

13. The field-effect transistor according to claim 11, wherein:
the portion of the gate electrode corresponding to the canopy of the open umbrella overhangs on the side of the gate electrode, toward the drain electrode, by at least 1 µm; and
space between the portion of the gate electrode corresponding to the canopy of the open umbrella and the semiconductor layer is filled with the silicon nitride film from a side surface of the gate electrode corresponding to a shank of the umbrella and extending less than 1 µm toward the drain electrode, and remaining space constitutes the void volume.

* * * * *